United States Patent
Okuno

(10) Patent No.: US 8,648,939 B2
(45) Date of Patent: Feb. 11, 2014

(54) SOLID-STATE IMAGING DEVICE, DRIVE METHOD THEREFOR, AND ELECTRONIC DEVICE

(75) Inventor: Jun Okuno, Kanagawa (JP)

(73) Assignee: Sony Corporation, Tokyo (JP)

( * ) Notice: Subject to any disclaimer, the term of this patent is extended or adjusted under 35 U.S.C. 154(b) by 61 days.

(21) Appl. No.: 12/836,737

(22) Filed: Jul. 15, 2010

(65) Prior Publication Data

US 2011/0019038 A1    Jan. 27, 2011

(30) Foreign Application Priority Data

Jul. 23, 2009    (JP) .................................. 2009-172382

(51) Int. Cl.
*H04N 5/217*    (2011.01)
*H04N 9/64*    (2006.01)

(52) U.S. Cl.
USPC ............ 348/246; 348/241; 348/247; 348/248

(58) Field of Classification Search
None
See application file for complete search history.

(56) References Cited

U.S. PATENT DOCUMENTS

| | | | | |
|---|---|---|---|---|
| 6,903,768 | B1 * | 6/2005 | Ohsawa et al. ................ | 348/241 |
| 7,973,841 | B2 * | 7/2011 | Neukom ........................ | 348/294 |
| 8,026,961 | B2 * | 9/2011 | Takenaka et al. ............. | 348/241 |
| 2004/0150729 | A1 * | 8/2004 | Nishizawa et al. ........... | 348/243 |
| 2006/0268135 | A1 * | 11/2006 | Lim et al. ...................... | 348/243 |
| 2007/0165120 | A1 * | 7/2007 | Takane .......................... | 348/248 |
| 2008/0049125 | A1 * | 2/2008 | Subbotin ....................... | 348/241 |
| 2008/0100728 | A1 * | 5/2008 | Nagata .......................... | 348/247 |
| 2009/0073289 | A1 * | 3/2009 | Xu et al. ....................... | 348/243 |
| 2009/0122165 | A1 * | 5/2009 | Kinoshita ..................... | 348/241 |
| 2009/0213256 | A1 * | 8/2009 | Kudoh .......................... | 348/302 |
| 2009/0303357 | A1 * | 12/2009 | Tajima et al. ................. | 348/246 |
| 2010/0026862 | A1 * | 2/2010 | Nishiwaki .................... | 348/246 |
| 2011/0221939 | A1 * | 9/2011 | Jerdev .......................... | 348/246 |

FOREIGN PATENT DOCUMENTS

| | | |
|---|---|---|
| JP | 2001-339643 | 12/2001 |
| JP | 2004-111590 | 4/2004 |
| JP | 2006-352843 | 12/2006 |
| JP | 2007-074435 | 3/2007 |
| JP | 2009-027238 | 2/2009 |

OTHER PUBLICATIONS

Japanese Office Action from Japanese counterpart Japanese patent application No. JP 2009-172382 dated Feb. 26, 2013.

* cited by examiner

*Primary Examiner* — Lin Ye
*Assistant Examiner* — John H Morehead, III
(74) *Attorney, Agent, or Firm* — Dentons US LLP

(57) ABSTRACT

A solid-state imaging device includes: a normal pixel disposed in a pixel section capable of performing a global shutter, and including at least a photoelectric conversion part and a memory part adjacent to the photoelectric conversion part; and a leak-light correcting pixel disposed in the pixel section to correct degradation of an image quality originated from leak light leaked into the memory part.

16 Claims, 11 Drawing Sheets

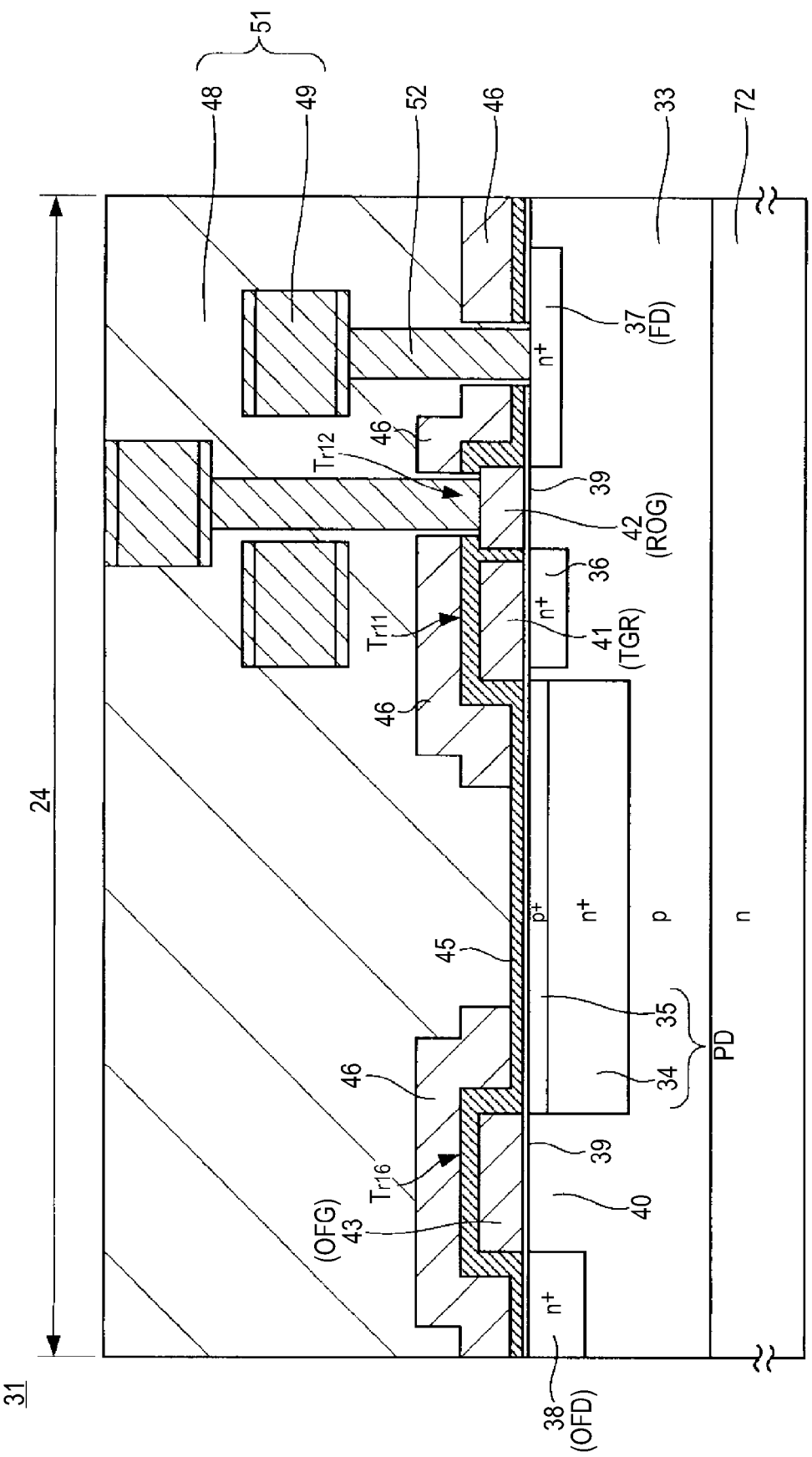

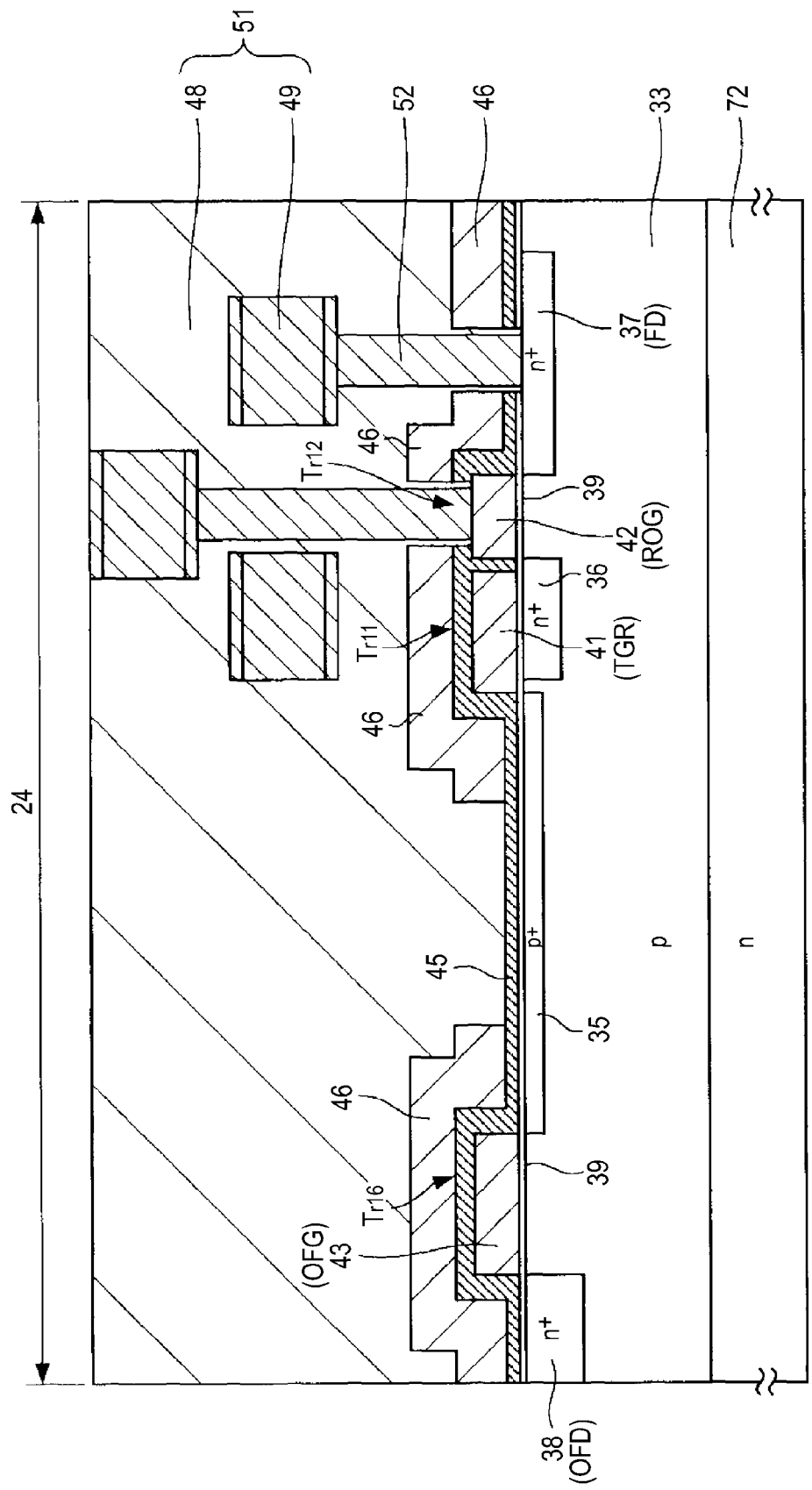

SOLID-STATE IMAGING DEVICE, DRIVE METHOD THEREFOR, AND ELECTRONIC DEVICE

BACKGROUND OF THE INVENTION

1. Field of the Invention

The present invention relates to a solid-state imaging device, a drive method therefor, and an electronic device equipped with the solid-state imaging device.

2. Description of the Related Art

Solid-state imaging devices are roughly classified into two types of solid-state imaging devices typified by a CCD (Charge Coupled Device) image sensor and a CMOS (Complementary Metal Oxide Semiconductor) image sensor. Those solid-state imaging devices are widely used in digital still cameras, digital video cameras, and so forth. Recently, from the viewpoints of a lower supply voltage and lower power consumption, MOS type image sensors are used more as solid-state imaging devices to be installed in mobile devices, such as camera-equipped cellular phones.

As a CMOS solid-state imaging device which achieves simultaneous storage in the individual pixels, a CMOS solid-state imaging device has been proposed which has a memory element (capacitor) provided for each pixel to ensure global shutter imaging. Since a CCD solid-state imaging device has a vertical transfer register and simultaneously into reads electric charges in all the pixels therein, the global shutter imaging can be implemented.

In the CCD solid-state imaging device having a vertical transfer register to ensure global shutter imaging, light leaks into the vertical transfer register, causing a smear. The CCD solid-state imaging device can detect a smear at an optical black pixel region (so-called optical black (OPB) region) for each column. Accordingly, the CCD solid-state imaging device can correct a smear by performing a process of subtracting a signal (OPB data) obtained from the optical black pixel region on from a signal acquired from a pixel (see, for example, JP-A-2006-210560 (Patent Document 1)).

SUMMARY OF THE INVENTION

The CMOS solid-state imaging device which has a memory element provided for each pixel to ensure global shutter imaging needs to cope with occurrence of a smear originated from light leaking into the memory element holding an electric charge and degradation of the image quality caused by the smear. Since a signal (smear) originated from light leaked into each pixel is not transferred to an optical black pixel region in the CMOS solid-state imaging device, leak light for each pixel cannot be detected. As a result, the CMOS solid-state imaging device capable of implement global shutter imaging has a problem that the degraded image quality originated from the leak light cannot be corrected.

Thus, it is desirable to provide a solid-state imaging device which can correct a signal originated from leak light leaked into a memory part in a CMOS solid-state imaging device which can implement global shutter imaging, and a drive method for the solid-state imaging device.

It is also desirable to provide an electronic device, such as a camera, equipped with such a solid-state imaging device.

A solid-state imaging device according to an embodiment of the present invention has a normal pixel and a leak-light correcting pixel disposed in a pixel section capable of performing a global shutter. The normal pixel includes at least a photoelectric conversion part and a memory part adjacent to the photoelectric conversion part. The leak-light correcting pixel corrects degradation of an image quality originated from leak light leaked into the memory part.

In the solid-state imaging device according to the embodiment of the invention, an electric charge corresponding to a combined signal of a normal pixel and a leak signal is stored in the memory part of the normal pixel, and the combined signal is output from the normal pixel. The leak-light correcting pixel outputs only a leak signal. Thereafter, the combined signal and the leak signal are subjected to a subtraction process to acquire a normal signal.

A drive method for a solid-state imaging device according to another embodiment of the invention uses a solid-state imaging device which has a normal pixel and a leak-light correcting pixel disposed in a pixel section having a plurality of pixels and capable of performing a global shutter. The normal pixel includes at least a photoelectric conversion part and a memory part adjacent to the photoelectric conversion part. The leak-light correcting pixel has at least a light receiving region and a memory part adjacent to the light receiving region.

According to the embodiments of the invention, a combined signal of a normal signal and a leak signal originated from leak light leaked into the memory part are output from the normal pixel, and only the leak signal originated from leak light leaked into the memory part is output from the leak-light correcting pixel. A subtraction process is performed on the combined signal from the normal pixel and the leak signal from the leak-light correcting pixel to correct a leak signal from the normal pixel.

Since the drive method for a solid-state imaging device according to the embodiment of the invention subtracts the normal signal from the normal pixel the leak signal originated from leak light into the memory part in subsequent signal processing, the leak signal in the normal pixel is corrected.

An electronic device according to still another embodiment of the invention includes an optical system, a solid-state imaging device, and a signal processing circuit that processes an output signal of the solid-state imaging device. The solid-state imaging device has a normal pixel and a leak-light correcting pixel disposed in a pixel section capable of performing a global shutter. The normal pixel includes at least a photoelectric conversion part and a memory part adjacent to the photoelectric conversion part. The leak-light correcting pixel corrects degradation of an image quality originated from leak light leaked into the memory part. Further, the solid-state imaging device has a function of performing a subtraction process on a signal acquired from the leak-light correcting pixel and a signal acquired from the normal pixel around the leak-light correcting pixel to correct the signal acquired from the normal pixel around the leak-light correcting pixel.

Since the electronic device according to the embodiment of the invention has the leak-light correcting pixel disposed in the pixel section of the solid-state imaging device, a leak signal can be detected. A leak signal in the normal pixel can be corrected by performing a subtraction process on the leak signal and a combined signal of the normal signal in the normal pixel and the leak signal.

As apparent from the above, the solid-state imaging device and drive method therefor according to the embodiments of the invention can correct a signal originated from leak light leaked into the memory part in the solid-state imaging device which can implement global shutter imaging.

Equipped with this solid-state imaging device, the electronic device according to the embodiment of the invention can correct a signal originated from leak light leaked into the memory part in the solid-state imaging device which can implement global shutter imaging, thus providing an electronic device with a high image quality and high quality.

BRIEF DESCRIPTION OF THE DRAWINGS

FIG. 5 is a configurational diagram of the essential portion of a leak-light correcting pixel in the pixel section, showing the solid-state imaging device according to the first embodiment of the invention;

FIG. 8 is a configurational diagram of the essential portion of a leak-light correcting pixel in the pixel section, showing a solid-state imaging device according to a second embodiment of the invention;

DESCRIPTION OF THE PREFERRED EMBODIMENTS

Modes for carrying out the present invention (hereinafter called "embodiments") will be described below. The description will be given in the following order.

1. Schematic Configurational Example of CMOS Solid-state Imaging Device
2. Basic Configurational Example According to Embodiment of the Invention
3. First Embodiment (Configurational Example of Solid-state Imaging Device)
4. Second Embodiment (Configurational Example of Solid-state Imaging Device)
5. Third Embodiment (Configurational Example of Solid-state Imaging Device)
6. Fourth Embodiment (Configurational Example of Electronic Device)

1. Schematic Configurational Example of CMOS Solid-State Imaging Device

Figure 1:
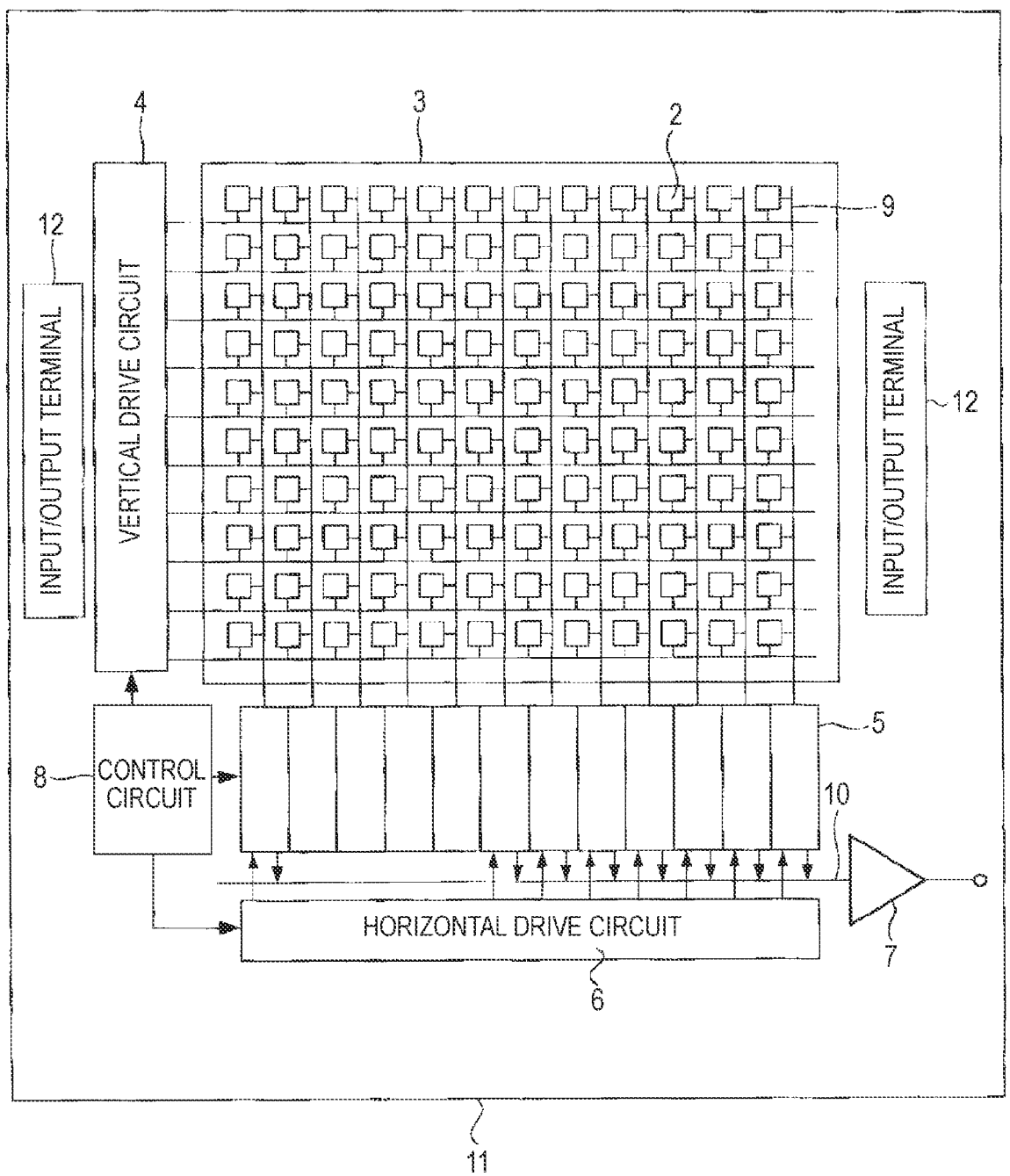
FIG. 1 is a schematic configurational diagram showing one example of a CMOS solid-state imaging device which is applicable to the invention.

FIG. 1 shows the schematic configuration of one example of a CMOS solid-state imaging device which is applied to individual embodiments of the invention. As shown in FIG. 1, a solid-state imaging device 1 according to the embodiment is configured to include a pixel section (so-called imaging region) 3 having a plurality of pixels 2, each including a photoelectric conversion part, arranged regularly in a two-dimensional array on a semiconductor substrate 11, for example, a silicon substrate, and a peripheral circuit part. An example of the circuit configuration of the pixel 2 will be described later.

The peripheral circuit part is configured to include a vertical drive circuit 4, a column signal processing circuit 5, a horizontal drive circuit 6, an output circuit 7, and a control circuit 8.

The control circuit 8 receives an input clock and data instructing an operational mode or the like, and outputs data, such as internal information of the solid-state imaging device. Specifically, the control circuit 8 generates clock signals to be operation references for the vertical drive circuit 4, the column signal processing circuit 5, the horizontal drive circuit 6, etc. based on a vertical sync signal, a horizontal sync signal and a master clock. The control circuit 8 then inputs those signals to the vertical drive circuit 4, the column signal processing circuit 5, the horizontal drive circuit 6, etc.

The vertical drive circuit 4 is constituted by, for example, a shift register. The vertical drive circuit 4 selects a pixel drive line, and supplies a pulse for driving pixels to the selected pixel drive line to drive the pixels row by row. That is, the vertical drive circuit 4 selectively scans the individual pixels 2 of the pixel section 3 row by row sequentially in the vertical direction, and supplies the column signal processing circuit 5 with a pixel signal which is generated according to the quantity of light received by, for example, a photodiode which is a photoelectric conversion element in each pixel 2 via a vertical signal line 9.

The column signal processing circuit 5 is disposed for, for example, each column of pixels 2, and performs signal processing, such as noise cancellation, on signals output from one row of pixels 2 for each pixel column. That is, the column signal processing circuit 5 performs signal processing, such as CDS (Correlated Double Sampling) for canceling unique fixed pattern noise of the pixels 2, signal amplification and AD conversion. A horizontal selection switch (not shown) is connected between the output stage of the column signal processing circuit 5 and a horizontal signal line 10.

The horizontal drive circuit 6 is constituted by, for example, a shift register. The horizontal drive circuit 6 sequentially outputs horizontal scan pulses to sequential select the column signal processing circuits 5, and outputs pixel signals from the column signal processing circuits 5 to the horizontal signal line 10.

The output circuit 7 performs signal processing on signals which are sequentially supplied from the column signal processing circuits 5 via the horizontal signal line 10, and outputs processed signals. For example, there may be a case where only buffering is performed, or a case where various kinds of digital signal processing, such as black level adjustment and column variation correction, are performed. An input/output terminal 12 exchanges signals with outside.

Figure 2:
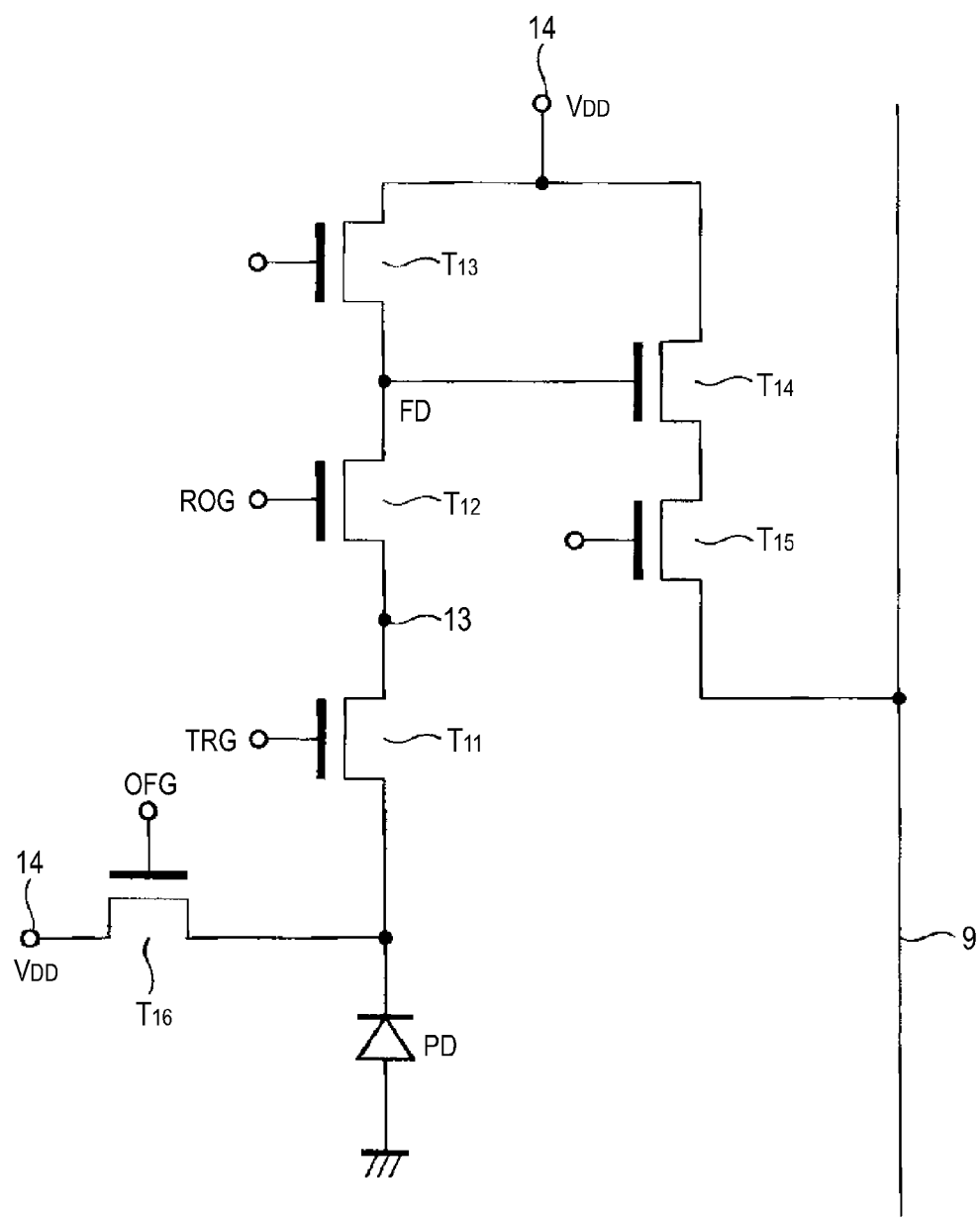
FIG. 2 is an equivalent circuit diagram showing one example of a unit pixel which is applicable to the invention.

FIG. 2 shows an example of the configuration of a unit pixel. A unit pixel 2 according to the circuit example includes, for example, a photodiode PD to be a photoelectric conversion part, a memory part 13 which temporarily stores a signal charge in the photodiode PD, and a pixel transistor having a plurality of MOS transistors. The pixel transistor includes six transistors, namely, a transfer transistor Tr11, a read transistor Tr12, a first reset transistor Tr13, an amplification transistor Tr14, a selection transistor Tr15, and a second reset transistor Tr16. The pixel transistor may take another circuit configuration which does not have the selection transistor.

The transfer transistor Tr11, connected between the photodiode PD and the memory part 13, transfers the signal charge stored in the photodiode PD (source side) to the memory part 13 (drain side) in response to a transfer pulse applied to the transfer gate of the transfer transistor Tr11. The read transistor Tr12 is connected between the memory part 13 and the floating diffusion part FD. The read transistor Tr12 reads the signal charge stored in the memory part 13 (source side) into the floating diffusion part FD (drain side) in response to a read pulse applied to a read gate electrode 42. The first reset transistor Tr13, connected between the floating diffusion part FD and a power supply 14, resets the floating diffusion part FD to a power supply potential $V_{DD}$ in response to a first reset pulse applied to the reset gate of the first reset transistor Tr13.

The amplification transistor Tr14 is connected between the drain of the selection transistor Tr15 and the power supply 14, with its amplification gate connected to the floating diffusion part FD. The selection transistor Tr15 has its source side connected to the vertical signal line 9. A pixel signal corresponding to the quantity of the signal charges read into the floating diffusion part FD is output to the vertical signal line 9 via the amplification transistor Tr14 and the selection transistor Tr15.

Further, the second reset transistor Tr16 serves as an electric shutter to discharge the electric charges stored in the photodiode PD for a certain period of time. The second reset transistor Tr16, connected between the photodiode PD and the power supply 14, resets the photodiode PD to the power supply potential $V_{DD}$ in response to a second reset pulse applied to the reset gate of the second reset transistor Tr16. The second reset transistor Tr16 is configured as a so-called overflow drain mechanism which has the reset gate serving as an overflow gate and the drain serving as an overflow drain.

A global shutter is enabled in the pixel section 3 for an exposure period. That is, when the second reset transistor Tr16 is turned on by the second reset pulse (so-called shutter pulse) applied thereto, the electric charges that are stored in the photodiodes PD of all the pixels so far are discharged to the overflow drain simultaneously. Then, the signal charges that are generated for the remaining exposure period are stored in the photodiodes PD of all the pixels. When next read-out, the transfer transistor Tr11 of all the pixels are turned on simultaneously, and the signal charges of the photodiodes PD of all the pixels are transferred to the memory parts 13 simultaneously. Thereafter, the read transistors Tr12 of one row of pixels are turned on, and the signal charges stored in the memory parts 13 are read into the floating diffusion parts FD pixel row by pixel row. Then, the signal charges are output on the vertical signal line 9 via the amplification transistors Tr14 and the selection transistors Tr15. When signal charges in one row of pixels are read out, the signal charges in the memory parts 13 are discharged via the first reset transistors Tr13. Signal charges in the memory parts 13 can be reset for each row of pixels, or for all the pixels simultaneously. Generally, signal charges in all the pixels are reset simultaneously.

2. Basic Configurational Example According to Embodiment of the Invention

The solid-state imaging device according to an embodiment of the invention has one pixel for correcting degradation of the image quality originated from leak light (hereinafter called "leak-light correcting pixel") arranged for a plurality of pixels. The leak-light correcting pixel outputs only a signal originated from leak light (leak signal; smear component). The solid-state imaging device according to the embodiment of the invention subtracts the signal acquired by the leak-light correcting pixel from the signal acquired from a normal pixel around the leak-light correcting pixel (combined signal of the normal signal and leak signal) to acquire only the normal signal, thereby correcting degradation of the image quality of the surrounding normal pixel. That is, the embodiment has a function of performing a subtraction process on the signal acquired by the leak-light correcting pixel from the signal acquired from an normal pixel around the leak-light correcting pixel to correct the signal acquired from the surrounding normal pixel.

FIG. 1 is a schematic configurational diagram shows one example of the pixel layout of a solid-state imaging device according to an embodiment of the invention. A pixel section 23 has normal pixels 22 or red, green and blue (RGB) pixels 22R, 22G and 22B arranged in, for example, a square lattice pattern or a Bayer pattern. According to the embodiment, leak-light correcting pixels 24 are arranged one for one set of pixels 25 in the pixel layout pattern in the effective pixel region. The other pixels in one set of pixels 25 are the normal pixels 22. That is, in the known one set of pixels formed by normal pixels in the effective pixel region, an arbitrary color pixel, e.g., a green pixel 22G, is replaced with the leak-light correcting pixel 24. At this time, a green filter is formed on a layer overlying the leak-light correcting pixel 24.

The red pixel 22R or the blue pixel 22B may be replaced with the leak-light correcting pixel 24. In this case, a red filter or a blue filter is formed on a layer overlying the leak-light correcting pixel 24. It is also possible to take a structure where no color filter is formed on a layer overlying the leak-light correcting pixel 24.

In this example, the Bayer type pixel layout pattern is designed in such a way that the leak-light correcting pixel 24 is replaced with one green pixel each set of pixels in the center in the pixels 25 having 3 pixel×3 pixel=9 pixels as one set. The ratio of the replacing leak-light correcting pixels 24 in thee entire effective pixel region is optional. Naturally, reducing this ratio can reduce the number of the leak-light correcting pixels 24. Since the reduction in the number of the leak-light correcting pixels 24 increases the interval between the leak-light correcting pixel 24 and the normal pixel 22, however, there occurs an error between the level of the leak signal from the leak-light correcting pixel 24 and the level of the leak signal originated from leak light from the normal pixel 22. It is therefore desirable to set the ratio of the leak-light correcting pixels 24 within the range where the error does not occur. Although the leak-light correcting pixels 24 are arranged in the case where the pixel layout pattern is a square lattice pattern in FIG. 3, the arrangement of the leak-light correcting pixels 24 is also effective in other pixel layout patterns, such as the Bayer layout pattern.

Each of the normal pixels 22 (22R, 22G, 22B) has, for example, a photodiode PD to be a photoelectric conversion part, a memory element (hereinafter called "memory part") 39, and a floating diffusion part (FD) 37.

The leak-light correcting pixel 24 has a light receiving region 54, the memory part 39, and the floating diffusion part (FD) 37.

3. First Embodiment

[Configurational Example of Solid-State Imaging Device]

Figure 3:
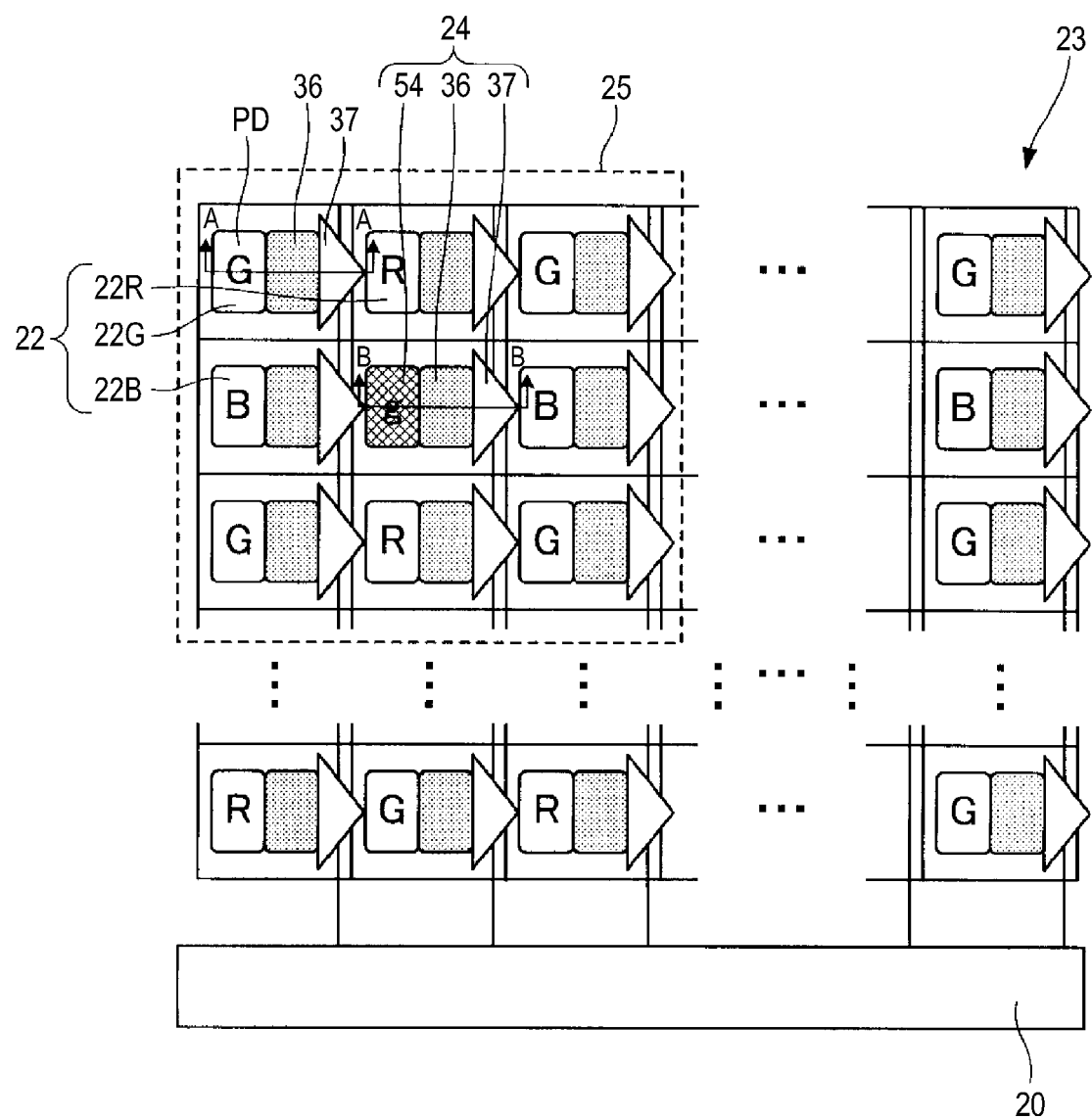
FIG. 3 is an exemplary diagram showing one example of a pixel layout pattern of a pixel section according to an embodiment of the invention.
Figure 4:
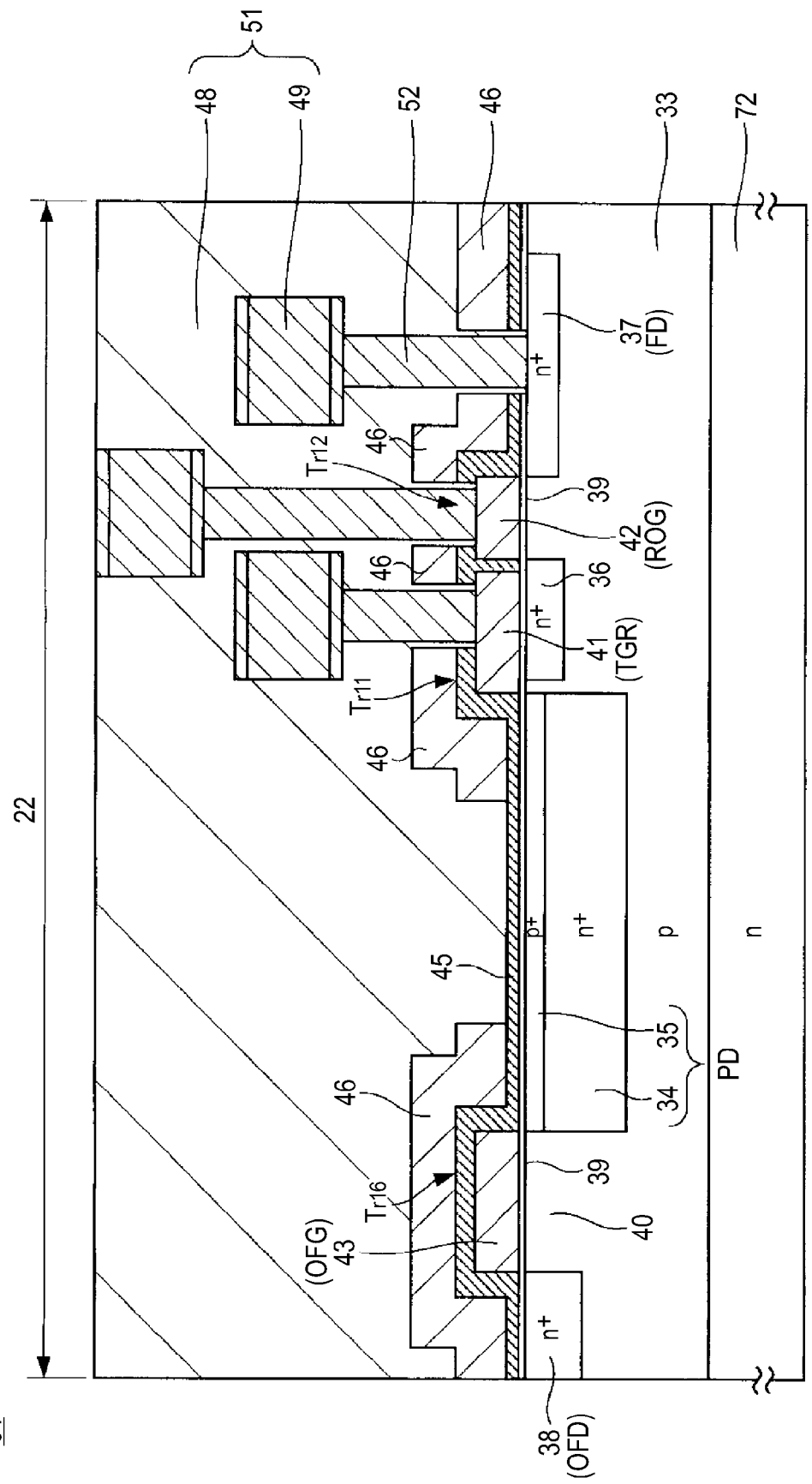
FIG. 4 is a configurational diagram of the essential portion of a normal pixel in the pixel section, showing a solid-state imaging device according to a first embodiment of the invention.

FIGS. 4 and 5 show a solid-state imaging device according to the first embodiment of the invention. The first embodiment employs a configuration having the pixel layout pattern shown in FIG. 3. FIG. 4 shows the cross section of the essential portion of a normal pixel corresponding to the line A-A in FIG. 3, and FIG. 5 shows the cross section of the essential portion of a leak-light correcting pixel corresponding to the line B-B in FIG. 3.

A solid-state imaging device 31 according to the first embodiment has a semiconductor substrate 32 of a first conductivity type, e.g., an n-type, in which a semiconductor well region 33 of a second conductivity type, e.g., a p-type, is formed, and has a normal pixel 22 and a leak-light correcting pixel 24 arranged in the p-type semiconductor well region 33 in the pixel layout pattern shown in FIG. 3.

As shown in FIG. 4, the normal pixel 22 [22R, 22G, 22B] has a photodiode PD to be a photoelectric conversion part, and a memory part 36 formed by an n-type semiconductor region, both formed in the top surface of the p-type semiconductor well region 33. A floating diffusion part (FD) 37 and an overflow drain mechanism 40 are formed in the top surface of the p-type semiconductor well region 33. The overflow drain mechanism 40 is configured as a second reset transistor Tr16.

The photodiode PD is configured as a buried type photodiode having a p-type semiconductor region 35 with a high impurity concentration at the top surface of the n-type semiconductor region 34 which serves as a charge storage layer. This p-type semiconductor region 35 also serves as a region to suppress the dark current. The memory part 36 is formed adjacent to one end of the photodiode PD. A transfer gate electrode (TRG) 41 is formed between the memory part 36 and the photodiode PD via a gate insulating film 39, thereby forming a transfer transistor Tr11. A read gate electrode (ROG) 42 is formed between the memory part 26 and the floating diffusion part (FD) 27 via the gate insulating film 39, thereby forming a read transistor Tr12. The overflow drain mechanism 40 has an overflow drain region 38 formed by an n-type semiconductor region adjacent to the other end of the photodiode PD. An overflow gate electrode (OFG) 43 is formed between the overflow drain region 38 and the photodiode PD via the gate insulating film 39, thereby forming the overflow drain mechanism 40 or the second reset transistor Tr16. The overflow gate electrode (OFG) 43 is equivalent to the second reset gate electrode, and the overflow drain region 38 is equivalent to the reset drain region.

A light shielding film 46 is formed at the upper portion of the substrate surface via an insulating film or an antireflection film 45 to prevent light from entering the memory part 36 or the floating diffusion part (FD) 37. In FIG. 4, the light shielding film 46 is formed to cover the transistors Tr11, Tr12, Tr16 and other pixel transistors (not shown), excluding on the photodiode PD. The light shielding film 46 is formed via the insulating film 45 which covers the transistors Tr11, Tr12, Tr16 and other pixel transistors (not shown) excluding on the photodiode PD. The floating diffusion part (FD) 37 is connected to a desired wiring 49 of a multilayer wiring layer 51 formed on the overlying layer via a contact via 52 penetrating the light shielding film 46. The multilayer wiring layer 51 is formed by disposing a plurality of wirings 49 via an interlayer insulating film 48. The transfer gate electrode 41 is likewise connected to the desired wiring 49 via the contact via 52 penetrating the light shielding film 46. The read gate electrode 42 is also connected to the desired wiring 49 via the contact via 52 penetrating the light shielding film 46. Though not illustrated, the overflow gate electrode 43 is also connected to the desired wiring 49 via the contact via 52 penetrating the light shielding film 46.

Since the other transistors constituting the pixel transistor, namely the first reset transistor Tr13, the amplification transistor Tr14, and the selection transistor Tr15 are similar to those of the normal pixel, their descriptions will be omitted.

As shown in FIG. 5, the leak-light correcting pixel 24 is configured in substantially the same way as the normal pixel 22 shown in FIG. 4. That is, in the leak-light correcting pixel 24, a light receiving region 54 formed by a photodiode PD having a pn junction to serve as a photoelectric conversion part is formed at the top surface of the p-type semiconductor well region 33. The memory part 36 and the floating diffusion part (FD) 37 which is an n-type semiconductor region are formed at the top surface of the p-type semiconductor well region 33. Further, the overflow drain mechanism 40 is formed at the top surface of the p-type semiconductor well region 33. This overflow drain mechanism 40 is configured as the second reset transistor Tr16.

The photodiode PD is configured as a buried type photodiode having a p-type semiconductor region 35 with a high impurity concentration at the top surface of the n-type semiconductor region 34 which serves as a charge storage layer. The memory part 36 is formed adjacent to one end of the photodiode PD. A transfer gate electrode (TRG) 41 is formed between the memory part 36 and the photodiode PD via a gate insulating film 39, thereby forming a transfer transistor Tr11. A read gate electrode (ROG) 42 is formed between the memory part 26 and the floating diffusion part (FD) 27 via the gate insulating film 39, thereby forming a read transistor Tr12. The overflow drain mechanism 40 has an overflow drain region 38 formed by an n-type semiconductor region adjacent to the other end of the photodiode PD. An overflow gate electrode (OFG) 43 is formed between the overflow drain region 38 and the photodiode PD via the gate insulating film 39, thereby forming the overflow drain mechanism 40 or the second reset transistor Tr16. The overflow gate electrode (OFG) 43 is equivalent to the second reset gate electrode.

A light shielding film 46 is formed at the upper portion of the substrate surface via an insulating film or an antireflection film 45 to prevent light from entering the memory part 36 or the floating diffusion part (FD) 37. In FIG. 5, the light shielding film 46 is formed to cover the transistors Tr11, Tr12, Tr16 and other pixel transistors (not shown), excluding on the photodiode PD. The gate of the transfer transistor Tr11 in the leak-light correcting pixel 24 is designed to be normally off. In this embodiment, a contact via for connecting the transfer gate electrode 41 of the transfer transistor Tr11 to the wiring 49 is omitted. In addition, the normally-off state may be realized by increasing the threshold voltage of the transfer transistor Tr11. Further, in this case, the transfer gate electrode 41 should desirably be grounded by the substrate or another wiring 49.

The floating diffusion part (FD) 37 is connected to the desired wiring 49 of the multilayer wiring layer 51 formed on the overlying layer via the contact via 52 penetrating the light shielding film 46. The read gate electrode 42 is connected to the desired wiring 49 via the contact via 52 penetrating the light shielding film 46.

The overflow gate (OFG) of the leak-light correcting pixel 24 is designed to be normally on. According to the embodiment, the normally-on state may be realized by decreasing the threshold voltage of the second reset transistor Tr16 having the overflow gate electrode 43. In this case, it is possible to take either a structure to apply a voltage to the gate electrode 43 or a structure which does not apply a voltage to the gate electrode 43; according to the idealistic vertical structure, a voltage is applied to the gate electrode 43. The idealistic vertical structure implies that the structure overlying the silicon substrate (vertical structure including the light shielding film 46, the multilayer wiring layer 51 and the contact via 52)

is equal for the normal pixel and the leak-light correcting pixel as much as possible. In this case, the gate electrode 43 for the leak-light correcting pixel and the gate electrode 43 for the normal pixel have the same structure. Since the gate electrode (OFG) 43 is connected to all the pixels at the same potential to simultaneously reset all the pixels, a voltage is applied to the gate electrode (OFG) 43 for the leak-light correcting pixel too.

In other words, the overflow gate (OFG) 43 is designed so as to be normally on to discharge all the charges generated by the photodiode PD to the overflow drain region 38. Though not illustrated, with the threshold voltage of the second reset transistor Tr16 being set equal to that of the normal pixel, and the overflow gate electrode 43 may be configured to be connected to the desired wiring 49 via the contact via 52, so that the voltage to set the overflow gate electrode 43 normally on is applied thereto.

Since the other transistors constituting the pixel transistor, namely the first reset transistor Tr13, the amplification transistor Tr14, and the selection transistor Tr15 are similar to those of the normal pixel, their descriptions will be omitted.

Figure 6C:
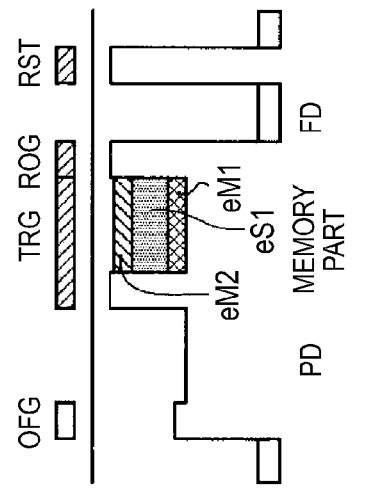
FIGS. 6A to 6C are diagrams showing the potential states of a normal pixel which is referred to in the description of a drive method for the solid-state imaging device according to the first embodiment.
Figure 6B:
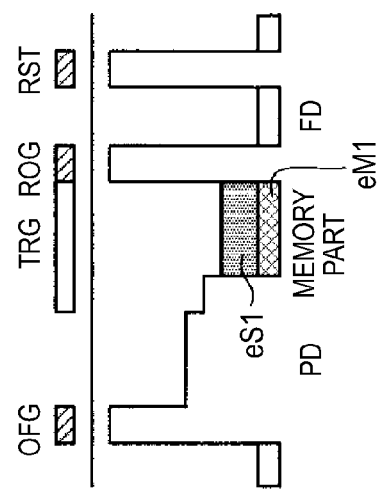
Figure 6A:
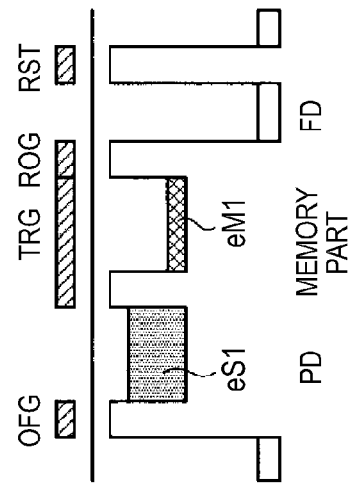
Figure 7A:
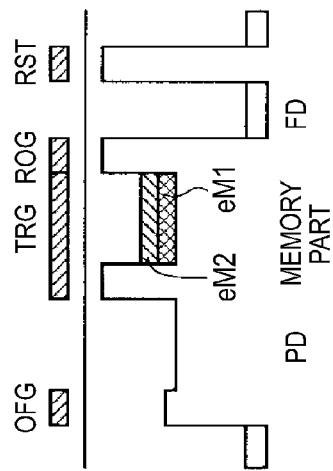
FIGS. 7A to 7C are diagrams showing the potential states of a leak-light correcting pixel which is referred to in the description of a drive method for the solid-state imaging device according to the first embodiment.
Figure 7B:
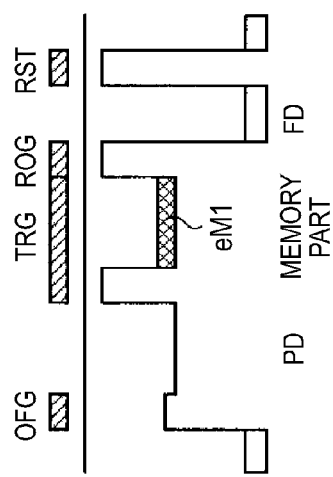
Figure 7C:
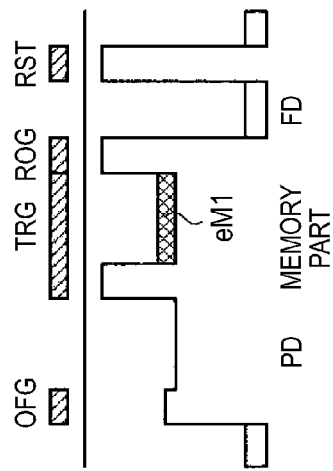

A drive method for the solid-state imaging device according to the first embodiment will be described referring to FIGS. 6A to 7C showing potential states. FIGS. 6A to 6C show the potential states of the normal pixel, and FIGS. 7A to 7C show the potential states of the leak-light correcting pixel.

When a reset pulse is applied to the overflow gate electrodes (OFG) 43 of the second reset transistors Tr16, all the pixels 22 [22R, 22G and 22B] in the pixel section 3 perform a global reset operation achieved by the complete discharging of charges.

When a transfer pulse is applied to the transfer gate electrodes (TRG) 41 of the transfer transistors Tr11 in the normal pixels 22, signal charges in all the pixels are transferred simultaneously. Therefore, all the normal pixels 22 in the pixel section 3 perform global shutter imaging which is achieved by the global reset operation and the simultaneous transfer from all the pixels.

FIGS. 6A and 7A show the potential states when exposure is finished. After exposure is finished, as shown in FIG. 6A, a charge is generated in the photodiode PD in the normal pixel 22, so that a normal signal charge eS1 is stored therein. Further, a leak signal charge eM1 originated from leak light leaked during exposure is stored in the memory part 36 of the normal pixel 22.

In the leak-light correcting pixel 24, as shown in FIG. 7A, the second reset transistor Tr16 is normally kept on, so that charges in the photodiode PD are all discharged to the overflow drain region 38, and charges are not stored in the photodiode PD. Only the leak signal charge eM1 originated from leak light leaked during exposure is stored in the memory part 36 of the leak-light correcting pixel 24. At the time of exposure, the charge generated in the light receiving region 54 is discharged to the overflow drain region 38 of the second reset transistor Tr16 adjacent to the light receiving region 54 in the leak-light correcting pixel 24, and the leak-light charge is stored only in the memory part 36.

FIGS. 6B and 7B show the potential states in the transfer operation after exposure is finished. In the normal pixel 22, as shown in FIG. 6B, the transfer transistor Tr11 is turned on to transfer the normal signal charge eS1 in every normal pixel to the memory part 36. As a result, the normal signal charge eS1 and the leak signal charge eM1 are added together in the memory part 36.

In the leak-light correcting pixel 24, as shown in FIG. 7B, the transfer transistor Tr11 is normally kept off, so that the transfer operation does not take place. Therefore, the leak signal charge eM1 is kept stored in the memory part 36.

FIGS. 6C and 7C show the potential states during holding of charges after charges are simultaneously transferred from all the normal pixels 22. The "during holding of charges" is the period in which while signal charges of one row of pixels are read out, signal charges in the other rows of pixels are not read out and are in a standby state. With a mechanical shutter being open (in case of imaging of a moving picture or the like), or without a mechanical shutter, light enters the solid-state imaging device even during holding of charges, so that light leaks into the memory part 36 and a leak signal charge eM2 is added to the leak signal charge eM1. As a result, in the normal pixel 22, the signal charge which is the sum of the normal signal charge eS1, the leak signal charge eM1 and the leak signal charge eM2 is stored in the memory part 36, as shown in FIG. 6C.

In the leak-light correcting pixel 24, as shown in FIG. 7C, the leak signal which is the sum of the leak signal charge eM1 and the leak signal charge eM2 is stored in the memory part 36.

The size of the leak signal charge eM2 in the normal pixel 22 and the leak-light correcting pixel 24 is proportional to the charge holding time, and increases until the read transistor Tr12 is turned on and the signal charge is transferred to the floating diffusion part (FD) 37. In the CMOS solid-state imaging device which enables global shutter imaging shown in FIG. 3, the read transistor Tr12 is turned on to perform the read operation pixel row by pixel row. Therefore, while the charge holding time differs pixel row by pixel row, the charge holding times are substantially identical because the leak-light correcting pixel 24 and the normal pixel 22 are located close to each other, so that the levels of the leak signal charges 2 become identical.

Thereafter, the read transistor Tr12 is turned on for each row of pixels, and the combined signal charge stored in the memory part 36 is read out to the floating diffusion part (FD) 37. Then, the combined signal charge is photoelectrically converted, and the combined signal of the normal signal S1 of the normal pixel 22, a leak signal M1 and a leak signal M2 is output onto the vertical signal line 9. The combined signal of a leak signal M1 and a leak signal M2 of the leak-light correcting pixel 24 is output onto the vertical signal line 9.

Then, the subtracting unit (subtracting circuit) located at the subsequent stage is used to perform a subtraction process on the leak signal acquired from the leak-light correcting pixel 24, and a signal containing the normal signal and the leak signal acquired from the normal pixel, thereby outputting the normal signal of the normal pixel. That is, an operation is performed on the combined signal of the leak signals M1 and M2 acquired from the leak-light correcting pixel 24, and the resultant signal is subtracted from the combined signal of the normal signal S1, the leak signals M1 and M2 acquired from the normal pixel 22 around the leak-light correcting pixel 24, so that only the normal signal S1 of the normal pixel 22 is output. It is apparent that the leak-light correcting pixel 24 can detect the leak signal (M1+M2) which enters the normal pixel 22 adjacent thereto. The execution of the subtraction process can correct the leak signal from the normal pixel 22.

In the floating diffusion part (FD) 37, electrons leak from the interface with the insulating film, generating the dark current. The dark currents in the floating diffusion parts (FD) 37 between the adjoining pixels become close to each other. Therefore, the execution of the subtraction process on the leak signal from the leak-light correcting pixel 24 and the signal from the normal pixel 22 adjoining thereto can reduce the dark current in the floating diffusion part (FD) 37 in the normal pixel 22.

When the amount of the leak signals (amount of smear) differs among the red, green and blue normal pixels according to the color filters, the subtraction process may be carried out after performing signal processing of weighting on the amount of the leak signals from the leak-light correcting pixel.

Figure 10:
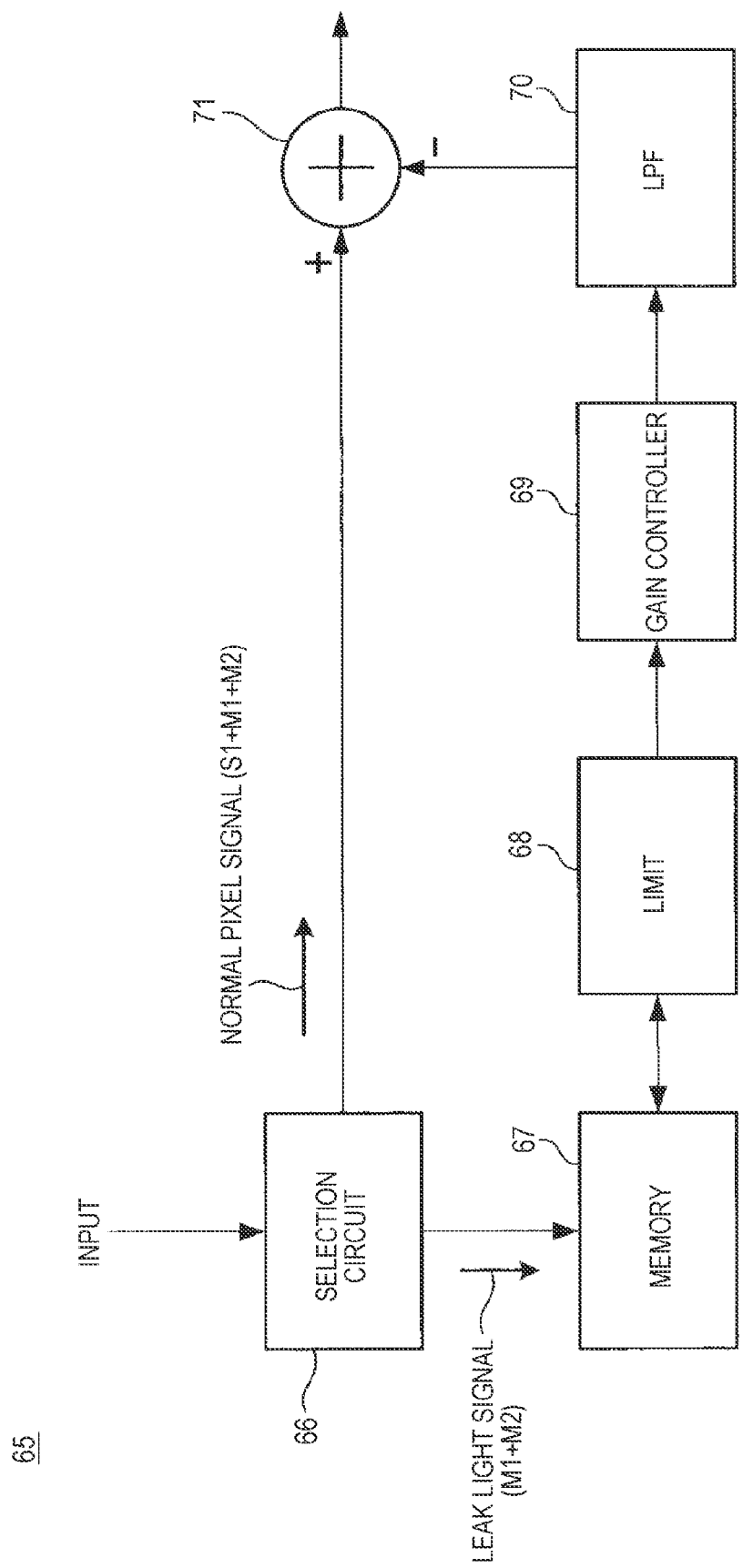
FIG. 10 is a diagram showing a correction circuit according to an embodiment of the invention.

FIG. 10 shows one example of a correction circuit 65 located at a subsequent stage to perform the subtraction process. The correction circuit 65 includes a selection circuit 66, a subtraction circuit 71, a memory circuit 67, a limit circuit 68, a gain controller 69, and a low-pass filter 70. The combined signal (S1+M1+M2) from the red pixel 22R, green pixel 22G and blue pixel 22B of the normal pixel 22 and the leak signal (M1+M2) from the leak-light correcting pixel 24 are input to the selection circuit 66. The combined signal from the normal pixel 22, which is one of the two inputs selected by the selection circuit 66, is input to the subtraction circuit 71, and the leak signal or the other input from the leak-light correcting pixel 24 is input to the memory circuit 67 to be stored therein. The leak signal output from the memory circuit 67 is input to the limit circuit 68 where it is determined whether or not the leak signal is to be corrected. When the leak signal is greater than a predetermined threshold value, it is determined that the leak signal is to be corrected, and the leak signal is input to the gain controller 69. The gain controller 69 corrects the level of the leak signal according to the leak signal which is input to the selection circuit 66. For example, the level of the leak signal stored in the memory part of a pixel differs according to the color. Therefore, the gain controller 69 sets the amount of correction of the leak-light correcting pixel 24 or weighting of the level of the leak signal from the leak-light correcting pixel 24 according to the leak signal of, for example, each of the red, green and blue normal pixels. Next, the leak signal of the leak-light correcting pixel 24 which is output from the gain controller 69 is input to the subtraction circuit 71 via the low-pass filter 70. Then, the subtraction circuit 71 performs a subtraction process on the combined signal of the signals from the red pixel 22R, green pixel 22G and blue pixel 22B and the leak signal of the leak-light correcting pixel 24, and outputs a normal signal.

The solid-state imaging device 31 and drive method according to the first embodiment can detect a leak signal originated from leak light leaked into the memory part 36 in a CMOS solid-state imaging device which has the memory part 36 for each pixel and ensures global shutter imaging, and correct the leak signal. Examples of the leak signal originated from leak light leaked into the memory part 36 include a leak signal transmitting via the light shielding film 46, a leak signal leaking from between the substrate and the light shielding film 46, a leak signal originated from direct light and diffracting light leaking from the opening region of the photodiode PD, a leak signal originated from electron diffusion from the p-type semiconductor region of the surface of the photodiode PD, and a leak signal originated from electron diffusion from outside the n-type semiconductor region to be the memory part 36.

Further, since the dark currents to be floating diffusion parts (FD) 37 of adjoining pixels are close to each other according to the embodiment, so that the dark current of the floating diffusion part (FD) 37 can be reduced also by signal processing.

As the leak-light correcting pixel 24 and the normal pixel 22 are designed to have the same structure, light leaking into the memory part of the leak-light correcting pixel becomes equal to light leaking into the memory part of the normal pixel. This is because the amount of the light leaking into the memory part is a very small amount of several 10e− in terms of the number of electrons, and greatly depends on the vertical peripheral structure.

4. Second Embodiment

[Configurational Example of Solid-State Imaging Device]

FIG. 8 shows a solid-state imaging device according to an embodiment of the invention, particularly, a leak-light correcting pixel according to the second embodiment. The second embodiment, like the first embodiment, takes the structure having the pixel layout pattern shown in FIG. 3. FIG. 8 shows the cross-sectional structure of the essential portion of the leak-light correcting pixel taken along line B-B in FIG. 3. Since the normal pixel is the same as that described in the foregoing description of the first embodiment.

A solid-state imaging device 61 according to the second embodiment has a semiconductor substrate 32 of a first conductivity type, e.g., an n-type, in which a semiconductor well region 33 of a second conductivity type, e.g., a p-type, is formed, and has a normal pixel 22 and a leak-light correcting pixel 24 arranged in the p-type semiconductor well region 33 in the pixel layout pattern shown in FIG. 3.

As shown in FIG. 8, a light receiving region 54 formed on the surface of the p-type semiconductor well region 33, a memory part 36 formed by an n-type semiconductor region, a floating diffusion part (FD) 37 formed by an n-type semiconductor region, and an overflow drain mechanism 40 are formed in the leak-light correcting pixel 24. The light receiving region 54 is configured to omit an ion-implanted n-type semiconductor region 34 and have no pn junction. Only a p-type semiconductor region 35 with a high impurity concentration for suppressing the dark current is formed at the top surface. The light receiving region 54 can be configured not to have the p-type semiconductor region 35 formed therein. The overflow drain mechanism 40 adjacent to the light receiving region 54 is configured as the second reset transistor Tr16.

Since the structures of the memory part 36, the floating diffusion part (FD) 37 and the overflow drain mechanism 40 are the same as those described in the foregoing description of the first embodiment, same reference numerals are given to the corresponding portions in FIG. 4 to avoid the redundant description. Since the structures of the transfer transistor Tr11, the read transistor Tr12, the second reset transistor Tr16, and so forth are the same as those described in the foregoing description of the first embodiment, same reference numerals are given to the corresponding portions in FIG. 4 to avoid the redundant description.

Next, the drive method for the solid-state imaging device 61 according to the second embodiment will be described. The potential states of the normal pixels 22 [22R, 22G, 22B] are the same as those of the first embodiment as shown in FIGS. 6A to 6C. After exposure is finished, the normal signal charge eS1 is stored in the photodiode PD, and the leak signal charge eM1 originated from leak light is stored in the memory part 36 (see FIG. 6A). At the time of transfer, when the transfer transistors Tr11 are turned on, the normal signal charges eS1 in the photodiodes PD in all the pixels are simultaneously transferred to the memory parts 36 to be each added to the leak signal charge eM1 (see FIG. 6B). Thereafter, light is leaked into the memory part 36 to be added with the leak signal charge eM2 while the charges are held.

If light is input to the light receiving region 54 in the leak-light correcting pixel 24, the light receiving region 54 does not have pn junction, so that a signal charge is not stored therein. After exposure, therefore, the leak signal charge eM1 is stored only in the memory part 36. Since the transfer transistor Tr11 of the vertical drive circuit 4 is normally off, the leak signal charge eM1 is kept stored in the memory part 36 in the leak-light correcting pixel 24 even at the time of transferring the normal signal charge eS1 of the normal pixel 22. Thereafter, light leaks into the memory part 36 to be added with the leak signal charge eM2 even during the subsequent holding of charges.

Thereafter, the read transistor Tr12 is turned on pixel row by pixel row as described in the foregoing description of the first embodiment, causing the combined signal (eS1+eM1+eM2) of the normal pixel 22 to be read into the floating diffusion part (FD) 37. Further, the combined leak signal charge (eM1+eM2) of the leak-light correcting pixel 24 is read into the floating diffusion part (FD) 37. Then, the combined leak signal (M1+M2) of the leak-light correcting pixel 24 is subtracted from the combined signal (S1+M1+M2) of the normal pixel 22 after photoelectric conversion, outputting only the normal signal S1 of the normal pixel 22. In this manner, the leak-light correcting pixel 24 can detect the leak signal (M1+M2) which is input to the adjoining normal pixel 22.

The solid-state imaging device 61 and drive method according to the second embodiment demonstrate effects similar to those of the first embodiment, such that the CMOS solid-state imaging device which enables global shutter imaging can detects a leak signal leaking into the memory part 36 and correct the leak signal. Since the light receiving region 54 of the leak-light correcting pixel 24 does not have pn junction, it is easier to fabricate the solid-state imaging device. The first embodiment needs an additional step or mask to change the characteristics of transistors, whereas the second embodiment does not need such an additional step or mask.

The overflow gate electrode (OFG) 43 and the overflow drain region 38 in FIG. 8 may be omitted. It is to be noted that it is advantageous to configure the leak-light correcting pixel 24 to have the same structure as the normal pixel 22 as much as possible because the leak signal (smear amount) can be detected accurately to provide the proper correlation between the leak signal and the leak signal of the normal pixel.

5. Third Embodiment

[Configurational Example of Solid-State Imaging Device]

Figure 9:
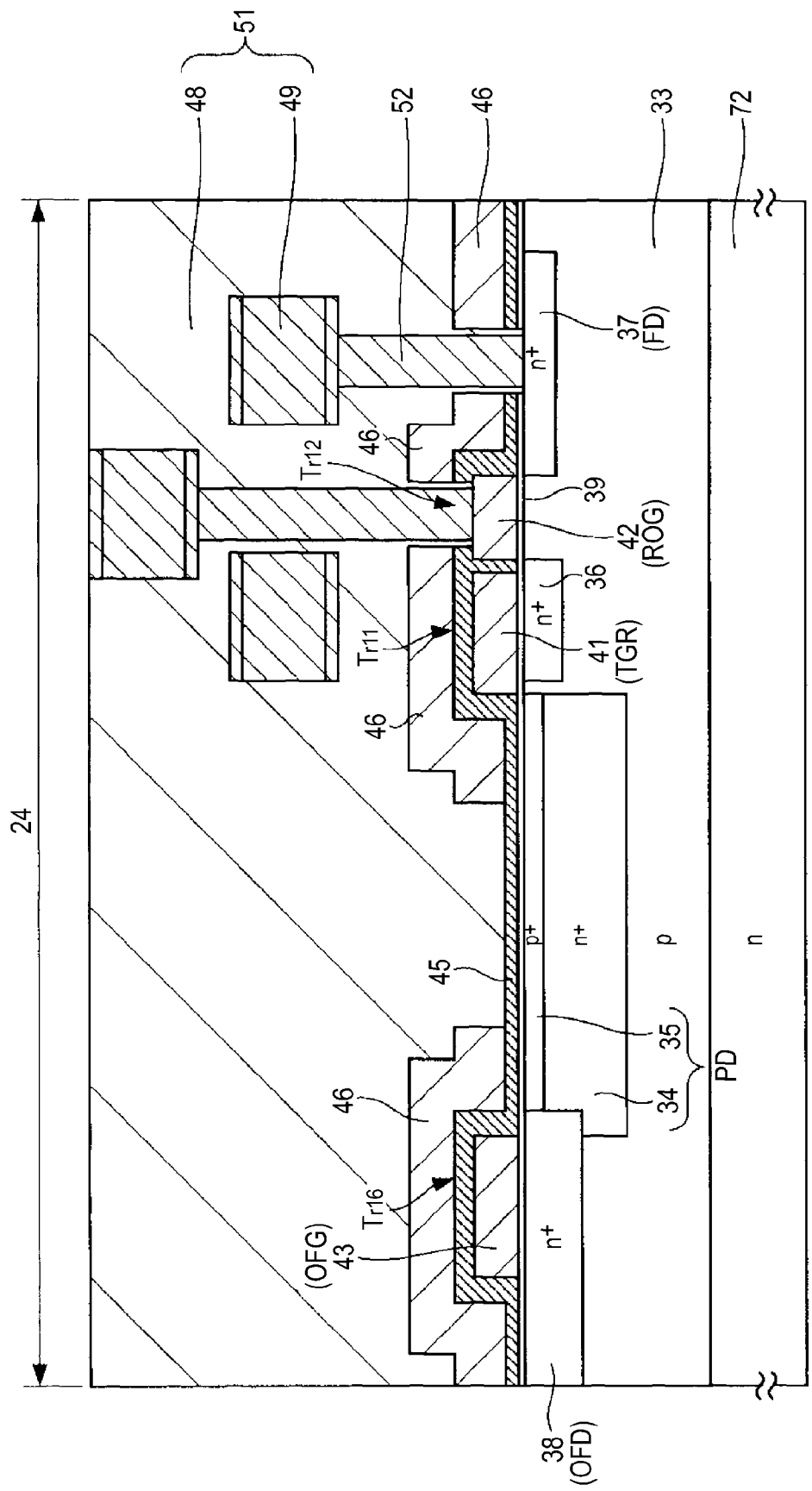
FIG. 9 is a configurational diagram of the essential portion of a leak-light correcting pixel in the pixel section, showing a solid-state imaging device according to a third embodiment of the invention.

FIG. 9 shows a solid-state imaging device according to an embodiment of the invention, particularly, a leak-light correcting pixel according to the third embodiment. The third embodiment, like the first embodiment, takes the structure having the pixel layout pattern shown in FIG. 3. FIG. 9 shows the cross-sectional structure of the essential portion of the leak-light correcting pixel taken along line B-B in FIG. 3. Since the normal pixel is the same as that described in the foregoing description of the first embodiment.

A solid-state imaging device 63 according to the third embodiment has a semiconductor substrate 32 of a first conductivity type, e.g., an n-type, in which a semiconductor well region 33 of a second conductivity type, e.g., a p-type, is formed, and has a normal pixel 22 and a leak-light correcting pixel 24 arranged in the p-type semiconductor well region 33 in the pixel layout pattern shown in FIG. 3.

As shown in FIG. 8, a light receiving region 54 formed on the surface of the p-type semiconductor well region 33, a memory part 36 formed by an n-type semiconductor region, a floating diffusion part (FD) 37 formed by an n-type semiconductor region, and an overflow drain mechanism 40 are formed in the leak-light correcting pixel 24. The light receiving region 54 is configured as a buried type photodiode which has a p-type semiconductor region 35 with a high impurity concentration formed at the top surface of an n-type semiconductor region 34 to be a charge storage layer. The overflow drain mechanism 40 is configured as the second reset transistor Tr16, and, like that of the first embodiment, has an overflow drain region 38, and an overflow gate electrode (OFG) 43 disposed with a gate insulating film 39 in between. The n-type semiconductor region 34 of the light receiving region 54 is connected to the overflow drain region 38 of the overflow drain mechanism 40. In this embodiment, the overflow drain region 38 is elongated to extend under the overflow gate electrode (OFG) 43 to be connected to the n-type semiconductor region 34 of the light receiving region 54. The overflow gate electrode (OFG) 43 can apply a ground (GND) potential.

Since the structures of the memory part 36, the floating diffusion part (FD) 37, the transfer transistor Tr11, the read transistor Tr12, and so forth are the same as those described in the foregoing description of the first embodiment, same reference numerals are given to the corresponding portions in FIG. 4 to avoid the redundant description.

Next, the drive method for the solid-state imaging device 63 according to the third embodiment will be described. The potential states of the normal pixels 22 [22R, 22G, 22B] are the same as those of the first embodiment as shown in FIGS. 6A to 6C. After exposure is finished, the normal signal charge eS1 is stored in the photodiode PD, and the leak signal charge eM1 originated from leak light is stored in the memory part 36 (see FIG. 6A). At the time of transfer, when the transfer transistors Tr11 are turned on, the normal signal charges eS1 in the photodiodes PD in all the pixels are simultaneously transferred to the memory parts 36 to be each added to the leak signal charge eM1 (see FIG. 6B). Thereafter, light leaks into the memory part 36 to be added with the leak signal charge eM2 while the charges are held.

In the leak-light correcting pixel 24, the n-type semiconductor region 34 of the light receiving region 54 is connected to the overflow drain region 38, thereby normally providing a conductive state between the n-type semiconductor region 34 and the overflow drain region 38. Therefore, although a charge is generated in the light receiving region 54 with the photodiode PD structure during the exposure period, the generated charge is discharged to the overflow drain region 38, and is not stored in the light receiving region 54. After exposure, therefore, the leak signal charge eM1 is stored only in the memory part 36. Since the transfer transistor Tr11 of the leak-light correcting pixel 24 is normally off, the leak signal charge eM1 is kept stored in the memory part 36 in the leak-light correcting pixel 24 even at the time of transferring the normal signal charge eS1 of the normal pixel 22. Thereafter, light leaks into the memory part 36 to be added with the leak signal charge eM2 even during the subsequent holding of charges.

Thereafter, the read transistor Tr12 is turned on pixel row by pixel row as described in the foregoing description of the first embodiment, causing the combined signal (eS1+eM1+eM2) of the normal pixel 22 to be read into the floating diffusion part (FD) 37. Further, the combined leak signal charge (eM1+eM2) of the leak-light correcting pixel 24 is read into the floating diffusion part (FD) 37. Then, the combined leak signal (M1+M2) of the leak-light correcting pixel 24 is subtracted from the combined signal (S1+M1+M2) of the normal pixel 22 after photoelectric conversion, outputting only the normal signal S1 of the normal pixel 22. In this manner, the leak-light correcting pixel 24 can detect the leak signal (M1+M2) which is input to the adjoining normal pixel 22.

Although the light shielding film 46 is formed at the upper portions of the normal pixel 22 and the leak-light correcting pixel 24 in this embodiment, the invention can be adapted to a case where the normal pixels 22 and the leak-light correcting pixel 24 do not have the light shielding film 46.

6. Fourth Embodiment

[Configurational Example of Electronic Device]

The solid-state imaging devices according to the embodiments of the invention can be adapted to electronic devices, such as camera systems like a digital camera and a video camera, a cellular phone having an imaging function, and other devices having an imaging function.

Figure 11:
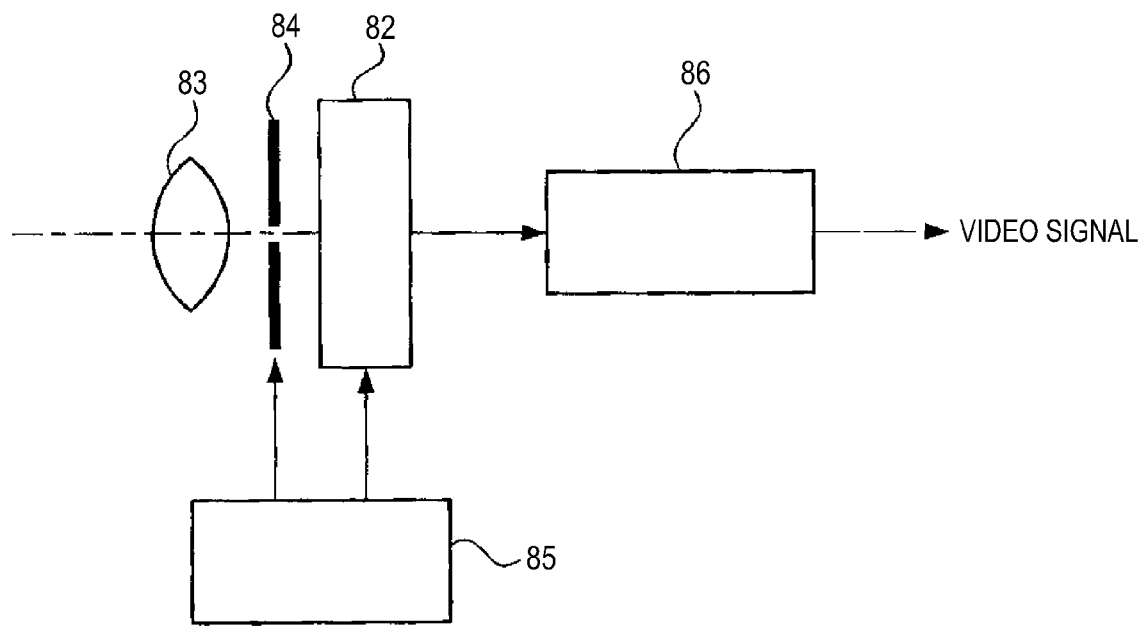
FIG. 11 is a schematic configurational diagram of an electronic device according to a fourth embodiment of the invention.

FIG. 11 shows a fourth embodiment adapted to a camera as one example of an electronic device according to the invention. The camera according to the fourth embodiment is a video camera, as an example, which can capture a still image or a moving picture. A camera 81 according to the embodiment has a solid-state imaging device 82, an optical system 83 which guides input light to the light receiving sensor part of the solid-state imaging device 82, and a shutter unit 84. The camera 81 further has a drive circuit 85 which drives the solid-state imaging device 82, and a signal processing circuit 86 which processes the output signal of the solid-state imaging device 82.

Any one of the solid-state imaging devices according to the individual embodiments is applied to the solid-state imaging device 82. The optical system (optical lens) 83 forms the image of image light (input light) from a subject on the imaging surface of the solid-state imaging device 82. As a result, signal charges are stored in the solid-state imaging device 82 for a given period. The optical system 83 may be an optical lens system having a plurality of optical lenses. The shutter unit 84 controls the light irradiation period and light shielding period of the solid-state imaging device 82. The drive circuit 85 supplies drive signals to control the transfer operation of the solid-state imaging device 82 and the shutter operation of the shutter unit 84. Signal transfer of the solid-state imaging device 82 is carried out in response to the drive signal (timing signal) supplied from the drive circuit 85. The signal processing circuit 86 performs various kinds of signal processing. A video signal which has been subjected to signal processing is stored in a storage medium, such as a memory, or is output to a monitor.

The electronic device according to the fourth embodiment can correct a leak signal originated from light leaked into the memory part in the normal pixel in the solid-state imaging device, and output a normal signal with a reduced smear component. Therefore, this embodiment can provide an electronic device with a high image quality and high quality. For example, the embodiment can provide a camera with an improved image quality.

The present application contains subject matter related to that disclosed in Japanese Priority Patent Application JP 2009-172382 filed in the Japan Patent Office on Jul. 23, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method for driving a solid-state imaging device including first and second pixels, each of the first and the second pixels including at least a photoelectric conversion part and a memory part adjacent to the photoelectric conversion part, the drive method comprising the steps of:
   maintaining a transfer transistor of the second pixel in an OFF state and maintaining a potential barrier between the photoelectric conversion part of the second pixel and the memory part of the second pixel;
   outputting a combined signal of a signal from the first pixel and a leak signal from the second signal, the leak signal being generated from leak light leaked into the memory part of the second pixel from the first pixel;
   outputting only the leak signal; and
   performing a subtraction process on the combined signal and the leak signal to compensate for the leak light from the first pixel.

2. The drive method according to claim 1, wherein in the second pixel, the charge generated in the photoelectric conversion part of the second pixel is discharged to a reset part adjacent to the photoelectric conversion part, and a leak signal charge is stored only in the memory part of the second pixel.

3. An electronic device comprising:
   an optical system;
   a solid-state imaging device; and
   a signal processing circuit that processes an output signal of the solid-state imaging device,
   the solid-state imaging device having
   (a) a first pixel disposed in a pixel section capable of performing a global shutter, and including at least a photoelectric conversion part and a memory part adjacent to the photoelectric conversion part,
   (b) a second pixel disposed in the pixel section to correct degradation of an image quality due to leak light leaked into the memory part, the second pixel comprising a transistor with a gate configured to keep the transistor in an OFF state and maintain a potential barrier between a photoelectric conversion part of the second pixel and a memory part of the second pixel, and
   the solid-state imaging device configured to perform a subtraction process on a signal acquired from the second pixel and a signal acquired from the first pixel to correct the signal acquired from the first pixel.

4. A solid-state imaging device comprising a pixel section having first and second pixels, wherein each of the first and the second pixels includes at least a photoelectric conversion part and a memory part adjacent to the photoelectric conversion part, the second pixel comprising a transistor with a gate configured to keep the transistor in an OFF state and maintain a potential barrier between the photoelectric conversion part of the second pixel and the memory part of the second pixel so that a charge stored in the photoelectric conversion part of the second pixel is not being read.

5. The solid-state imaging device according to claim 4, wherein a signal acquired from the second pixel and a signal acquired from the first pixel are subjected to a subtraction process to enable correction of the signal acquired from the first pixel.

6. The solid-state imaging device according to claim 5, wherein:
   the first pixel has (a) a floating diffusion part and (b) a reset part used to reset an electric charge in the photoelectric conversion part of the first pixel, and the second pixel generates a leak signal from leak light leaked into the memory part of the second pixel from the first pixel.

7. The solid-state imaging device according to claim 6, wherein the second pixel has a reset part that is used to reset an electric charge in the photoelectric conversion part of the second pixel.

8. The solid-state imaging device according to claim 6, wherein the second pixel has the photoelectric conversion part that does not have a pn junction.

9. The solid-state imaging device according to claim 7, wherein each reset part has a respective reset drain region connected to a respective charge storage region adjacent to the respective memory part.

10. The solid-state imaging device according to claim 7, wherein the reset part of the second pixel has a transistor with a gate configured to normally keep the transistor in an OFF state at a time of light exposure.

11. The drive method according to claim 1 further comprising providing the photoelectric conversion part of the second pixel that lacks a pn junction.

12. The drive method according to claim 2 further comprising providing in the reset part a reset drain region connected to a charge storage region adjacent to the memory part.

13. The drive method according to claim 2 further comprising providing in the reset part a transistor having a gate configured to normally keep the transistor in an OFF state at a time of light exposure.

14. The electronic device according to claim 3, wherein the second pixel has a reset part that is used to reset an electric charge in the photoelectric conversion part of the second pixel.

15. The electronic device according to claim 3, wherein the second pixel has the photoelectric conversion part that lacks a pn junction.

16. The electronic device according to claim 14, wherein the reset part has a reset drain region connected to a charge storage region adjacent to the memory part.

* * * * *